(12) United States Patent
Camardello

(10) Patent No.: US 10,600,604 B2
(45) Date of Patent: Mar. 24, 2020

(54) PHOSPHOR COMPOSITIONS AND LIGHTING APPARATUS THEREOF

(71) Applicant: CURRENT LIGHTING SOLUTIONS, LLC, East Cleveland, OH (US)

(72) Inventor: Samuel Joseph Camardello, Ballston Spa, NY (US)

(73) Assignee: CURRENT LIGHTING SOLUTIONS, LLC, East Cleveland, OH (US)

( * ) Notice: Subject to any disclaimer, the term of this patent is extended or adjusted under 35 U.S.C. 154(b) by 208 days.

(21) Appl. No.: 15/631,362

(22) Filed: Jun. 23, 2017

(65) Prior Publication Data

US 2018/0374668 A1  Dec. 27, 2018

(51) Int. Cl.
| | |
|---|---|
| *H01J 1/63* | (2006.01) |
| *C09K 11/08* | (2006.01) |
| *C09K 11/77* | (2006.01) |
| *H01L 33/50* | (2010.01) |

(52) U.S. Cl.
CPC ............ *H01J 1/63* (2013.01); *C09K 11/0883* (2013.01); *C09K 11/7731* (2013.01); *H01L 33/502* (2013.01)

(58) Field of Classification Search
CPC ............ C09K 11/7731; C09K 11/0883; H01L 33/502
See application file for complete search history.

(56) References Cited

U.S. PATENT DOCUMENTS

| | | | |
|---|---|---|---|
| 5,760,532 A | 6/1998 | Makoto et al. | |
| 7,525,245 B2 | 4/2009 | Tamura et al. | |
| 8,114,313 B2* | 2/2012 | Hirosaki | C04B 35/597 252/301.4 R |
| 8,142,685 B2 | 3/2012 | Hirosaki | |
| 8,852,453 B2 | 10/2014 | Hirosaki | |
| 2008/0012038 A1 | 1/2008 | Teratani et al. | |
| 2009/0026915 A1 | 1/2009 | Nagatomi et al. | |
| 2009/0121615 A1 | 5/2009 | Le Toquin et al. | |
| 2010/0001631 A1 | 1/2010 | Gotoh et al. | |
| 2011/0012059 A1 | 1/2011 | Jia | |
| 2012/0049115 A1 | 3/2012 | Matsuda et al. | |
| 2013/0207538 A1 | 8/2013 | Hirosaki et al. | |
| 2013/0241395 A1 | 9/2013 | Matsuda et al. | |
| 2014/0036201 A1 | 2/2014 | Kanno et al. | |
| 2014/0332992 A1 | 11/2014 | Hirosaki | |
| 2016/0186055 A1 | 6/2016 | Yoo et al. | |

FOREIGN PATENT DOCUMENTS

| | | |
|---|---|---|
| CN | 101880527 A | 11/2010 |
| EP | 2058382 A1 | 5/2009 |

OTHER PUBLICATIONS

International Search Report and Written Opinion issued in connection with corresponding PCT Application No. PCT/US2018/033587 dated Sep. 27, 2018.
Pust et al., "Narrow-Band Red-Emitting Sr[LiAl3N4]:Eu2+ as a Next-Generation LED-Phosphor Material", Nature Materials, vol. 13, http://www.nature.com/nmat/journal/v13/n9/full/nmat4012.html, 2014, pp. 891-896.
Wang et al., "Blue-Emitting Sr3Si8-xAlxO7+xN8-x:Eu2+ Discovered by a Single-Particle-Diagnosis Approach: Crystal Structure, Luminescence, Scale-Up Synthesis, and Its Abnormal Thermal Quenching Behavior", Chemistry of Materials, vol. 27, Issue 22, http://pubs.acs.org/doi/abs/10.1021/acs.chemmater.5b03252?journalCode=cmatex, 2015, pp. 7689-7697.
Dutczak et al., "Eu2+ Luminescence in Strontium Aluminates", Royal Society of Chemistry (PCCP), vol. 17, http://dspace.library.uu.nl/bitstream/handle/1874/320864/c5cp01095k.pdf?sequence=1, May 12, 2015, pp. 15236-15249.
Kim et al., "Improved Synthesis of SrLiAl3N4:Eu2+ Phosphor Using Complex Nitride Raw Material", RSC Advances, vol. 6, Issue 66, Jun. 22, 2016, pp. 61906-61908.

\* cited by examiner

*Primary Examiner* — C Melissa Koslow
(74) *Attorney, Agent, or Firm* — Buckley, Maschoff & Talwalkar LLC

(57) ABSTRACT

A phosphor composition is presented. The phosphor composition includes a solid solution of aluminum nitride and a complex oxide including europium and strontium, where an amount of oxygen in the solid solution is at least 0.4 weight percent and less than 1 weight percent. A lighting apparatus including a phosphor material including the phosphor composition is also provided.

19 Claims, 2 Drawing Sheets

PHOSPHOR COMPOSITIONS AND LIGHTING APPARATUS THEREOF

BACKGROUND

The disclosure relates generally to phosphor compositions applicable to lighting systems. More particularly, the disclosure relates to oxynitride phosphor compositions for solid state lighting systems, and a lighting apparatus employing these phosphor compositions.

A phosphor is a luminescent material that absorbs radiation energy in a portion of the electromagnetic spectrum and emits radiation energy in another portion of the electromagnetic spectrum. Most of the phosphors emit radiation (also referred to as light herein) in the visible portion of the electromagnetic spectrum in response to excitation by a high energy electromagnetic radiation, for example ultraviolet radiation, blue radiation. Phosphors have been utilized for a variety of lighting applications such as fluorescent lamps, vacuum fluorescent displays (VFD), field emission displays (FED), plasma display panels (PDP), cathode ray tubes (CRT), light emitting diodes (LED), and the like.

However, many phosphors tend to lose efficiency gradually due to luminance deterioration. Hence, phosphors having maintained luminescence and improved lifetime performance are desired. There have been proposed nitrides and oxynitrides as phosphors that exhibit less luminance deterioration as compared to conventional phosphors. In the range of oxynitride-based phosphors, sialon (SiAlON) phosphor may be known to be superior in the fluorescent emission efficiency as well as in the temperature characteristic. In particular, europium doped α-sialon phosphor is excited in a wide wavelength region from ultraviolet rays to blue light to emits yellow to orange light and europium doped β-sialon emits green light. In addition, several phosphors may be produced by adding rare-earth elements to sialons.

Although several nitride-based and oxynitride-based phosphors have been proposed, the range of phosphors that are suitable for LEDs is limited.

BRIEF DESCRIPTION

Briefly, embodiments of the present disclosure provide a phosphor composition including a solid solution of aluminum nitride and a complex oxide that includes europium and strontium, where an amount of oxygen in the solid solution is at least 0.4 weight percent and less than 1 weight percent, based on a total weight of the solid solution.

In one embodiment, a phosphor composition is derived from combining aluminum nitride, europium oxide, and strontium carbonate and aluminum nitride; and firing the combination. A combination of europium oxide and strontium carbonate is in a range of from about 5 weight percent to about 10 weight percent, based on an amount of aluminum nitride.

Some embodiments relate to a lighting apparatus. The lighting apparatus includes a light source; and a phosphor material radiationally coupled to the light source. The phosphor material includes the phosphor composition.

DRAWINGS

These and other features, aspects, and advantages of the present invention will become better understood when the following detailed description is read with reference to the accompanying drawings, wherein.

DETAILED DESCRIPTION

Figure 1:
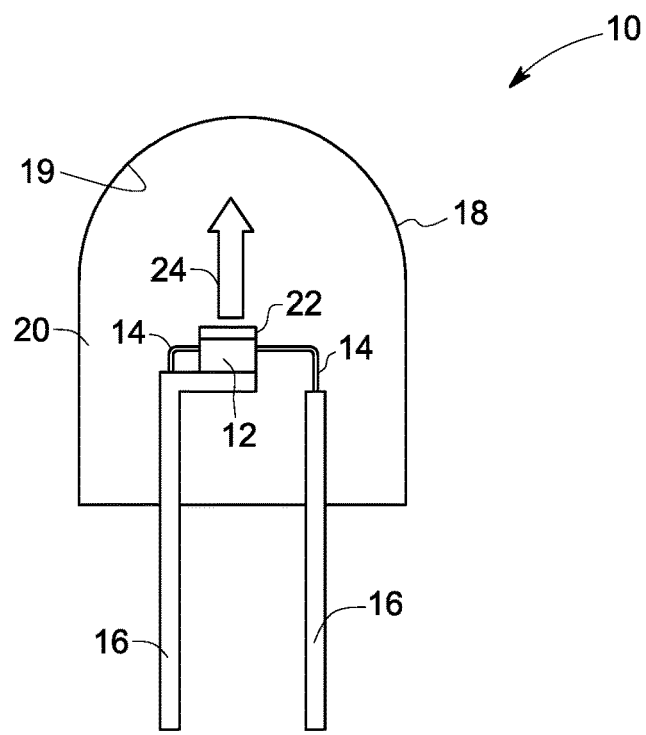
FIG. 1 is a schematic cross-sectional view of a lighting apparatus, in accordance with one embodiment of the disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

In the following specification and the claims that follow, the singular forms "a", "an" and "the" include plural referents unless the context clearly dictates otherwise. As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable, or suitable.

As used herein, the term "phosphor" or "phosphor material" or "phosphor composition" may be used to denote both a single phosphor composition as well as a blend of two or more phosphor compositions. As used herein, the term "lamp" or "lighting apparatus" or "lighting system" refers to any source of visible and/or ultraviolet light which can be generated by at least one light emitting element producing a light emission when energized, for example a phosphor material, a light emitting diode.

Particular application is described, herein, in conjunction with converting LED-generated ultraviolet (UV), violet, or blue radiation into a desired color light or white light for general illumination or other purposes. It should be appreciated, however, that the disclosure is also applicable to the conversion of radiation from UV, violet, and/or blue lasers, as well as other light sources, to a desired light.

Some embodiments of the present disclosure are directed to a phosphor composition. The phosphor composition includes a solid solution of aluminum nitride and a complex oxide having europium and strontium. An amount of oxygen in the solid solution is at least 0.4 weight percent and less than 1 weight percent, based on a total weight of the solid solution. In some embodiments, the amount of oxygen is in a range of from about 0.5 weight percent to about 0.9 weight percent. In some embodiments, the solid solution is free of silicon. In some embodiments, the solid solution may include negligible amount or less than 0.05 weight percent silicon (in form of a contaminant). In some embodiments, the phosphor composition is free of silicon. The presence of silicon (more than 0.05 weight percent) in the phosphor composition may reduce the intensity of the emission from the phosphor composition.

As used herein, the term "solid solution" refers to a solid-state solution of one or more solutes in a solvent material. In a solid solution, the crystal structure of the solvent material remains unchanged by addition of the solutes, and the mixture remains in a single homogeneous phase.

In some embodiments, the phosphor composition is derived from combining aluminum nitride, strontium carbonate, and europium oxide; and firing the combination. In first step, powders of the constituent compounds (that is, aluminum nitride, strontium carbonate, and europium oxide) are mixed in appropriate amounts. Mixing may include grinding by any technique known in the art.

In some embodiments, a combination of europium oxide and strontium carbonate is in a range of from about 5 weight percent to about 10 weight percent, based on an amount of aluminum nitride. In one embodiment, an amount of europium oxide in the combination is in a range of from about 3 weight percent to about 4 weight percent, based on an amount of aluminum nitride. In one embodiment, an amount of strontium carbonate in the combination is in a range wherein an amount of strontium carbonate is in a range of from about 1.5 weight percent to about 2.5 weight percent, based on the amount of aluminum nitride. The proportion of europium oxide and strontium carbonate with respect to aluminum nitride in the phosphor composition affects the optical properties of the phosphor composition. In some embodiments, a ratio of europium oxide to strontium carbonate in the combination is in a range of from about 1:4 to about 4:1. In some embodiments, the molar ratio of europium oxide to strontium carbonate is in a range of from about 1:2 to about 2:1. In certain embodiments, the molar ratio of europium oxide to strontium carbonate is about 1:1.

In next step, the combination formed in the first step is fired at a high temperature under an environment. The firing may include heating at a high temperature for a few minutes to a few hours. In one embodiment, the firing is carried out at a temperature higher than about 1000 degrees Celsius for more than 10 minutes. In some embodiments, the firing is carried out at a temperature in a range of from about 1300 degrees Celsius to about 2000 degrees Celsius. The firing may be carried out for 1 hour to about 10 hours. Further, the firing may be carried out under a high pressure to prevent decomposition of aluminum nitride. the firing may be carried out in a hydrogen-containing environment. The hydrogen-containing environment may include 0.5 percent hydrogen. A mixture of hydrogen and nitrogen can be used, containing from 90% by volume nitrogen up to substantially pure nitrogen. Usually, however, the reducing environment may contain from about 90% to about 99% by volume nitrogen. The firing environment may also include other inert gases such as argon etc. Although combinations of multiple gases may be utilized, consideration should be given to process design, and if the use of multiple gases provides no or negligible advantage, preference in some cases may be given to the utilization of only hydrogen and nitrogen.

In some embodiments, the firing step may include one or more sub-steps, where one or more of the sub-steps may be carried out by, for example, using a different temperature or pressure and/or a different environment. The sub-steps may also include grinding the combination in one or more of the sub-steps before subsequent firing.

After completing the firing step, a resulting phosphor composition is received that includes a solid solution of aluminum nitride and a complex oxide having europium and strontium. In one embodiment, an amount of oxygen in the solid solution is at least 0.4 weight percent and less than 1 weight percent. In some embodiments, the amount of oxygen is in a range of from about 0.5 weight percent to about 0.9 weight percent. In some embodiments, europium is present in an amount in a range of from about 0.5 weight percent to 8.0 weight percent in the phosphor composition. In some embodiments, strontium is present in an amount in a range of from about 0.25 weight percent to 4 weight percent in the phosphor composition.

In some embodiments, the complex oxide is $(Sr_{1-x}Eu_x)O$, where $0.2 \leq x < 1$. In some embodiments, $0.4 \leq x \leq 0.8$. In some embodiments, the solid solution of aluminum nitride and the complex oxide, has a formula $(1-y)AlN+y(Sr_{1-x}Eu_x)O$, where $0.2 \leq x < 1$ and $0.005 < y < 0.1$. In some embodiments, $0.01 \leq y \leq 0.05$. In certain instances, $0.4 \leq x < 0.8$ and $0.01 \leq y < 0.04$.

Quite generally, in the interest of brevity of the discussions herein, a phosphor composition formed by combining aluminum nitride and an oxide or a complex oxide may be referred to as AlN—O phosphor compositions. For example, a phosphor composition formed by combining aluminum nitride and europium oxide may be referred to as "AlN(Eu—O) phosphor composition" and a phosphor composition formed by combining aluminum nitride and a complex oxide (containing europium and strontium) as described herein, may be referred to as "AlN(Sr—Eu—O) phosphor composition" throughout the specification.

In some embodiments, the AlN(Sr—Eu—O) phosphor composition may include an additional activator ion. As used herein, the term "activator ion" refers to an ion (for example, $Eu^{2+}$) present in a phosphor that forms luminescent center and is responsible for the luminescence of the phosphor. Additional activator ions may include ions of Pr, Sm, Ce, Tb, Dy, Tm, Er, Ho, Nd, Bi, Pb, Yb, Mn, Ag, Cu, or any combinations thereof.

The AlN(Sr—Eu—O) phosphor compositions as described herein above absorb radiation in near-UV or blue region and emit green light. In some embodiments, the phosphor composition produce emission when absorb radiation in a wavelength range between about 250 nanometers (nm) and about 500 nm. In some embodiments, the phosphor composition absorb radiation in a wavelength range between about 300 nm and 480 nm. In certain embodiments, the phosphor composition produce its brightest emission when absorb radiation in a wavelength range between about 350 nm and 400 nm.

Figure 3:
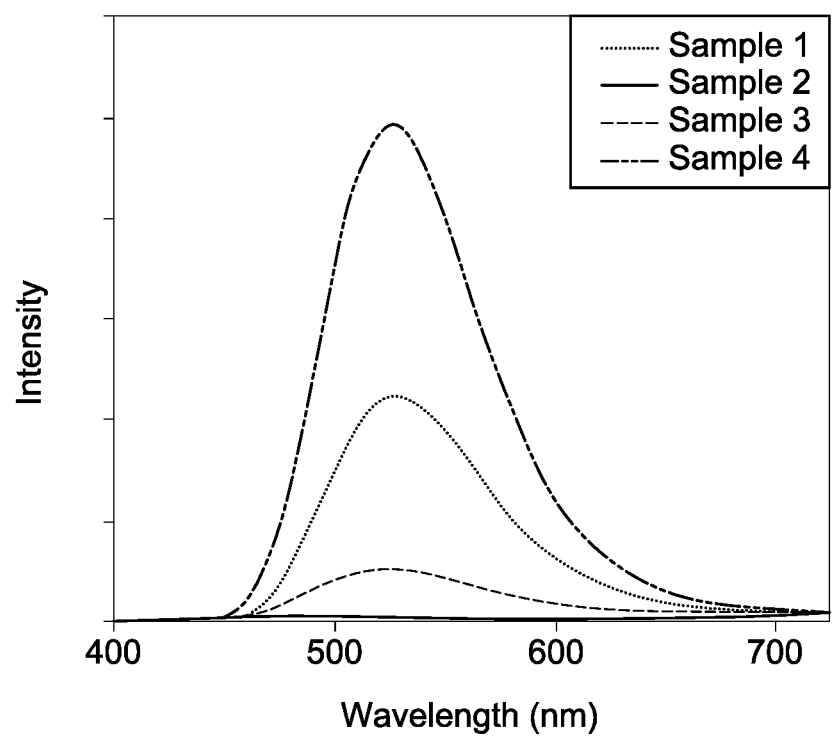
FIG. 3 shows emission spectrum of a phosphor composition in accordance with one embodiment of the disclosure as compared to emission spectra of conventional phosphors.

The AlN(Eu—Sr—O) phosphor compositions emit radiation in a wavelength range from about 450 nm to about 550 nm. In some embodiments, the phosphor compositions emit radiation having a peak emission in a wavelength range from about 480 nm to about 550 nm. In certain embodiments, the peak emission of the phosphor composition exists in a wavelength range from about 500 nm to about 540 nm. For example, FIG. 3 shows an emission spectrum of a AlN(Eu—Sr—O) phosphor composition containing europium and strontium, that has a peak emission at 530 nm and has a Full width at half maximum (FWHM) of 70 nm.

The phosphor compositions of the present disclosure (that include europium and strontium) have the advantage of producing high intensity/bright emission as compared to a conventional AlN(Eu—O) phosphor that includes europium and are free of strontium. In some embodiments, the AlN(Eu—Sr—O) phosphor composition as disclosed in above embodiments produce at least about two times brighter emission (i.e., higher intensity) than the conventional AlN (Eu—O) phosphor compositions. In some specific embodiments, the improvement in the emission intensity/brightness is at least 2.5 times.

These AlN(Sr—Eu—O) phosphor compositions may be used in a lighting apparatus to generate light suitable for general illumination and other purposes. In some embodiments, the phosphor compositions may be used in a lighting apparatus to generate green light for applications such as toys, traffic light, backlight, etc. In some embodiments, the phosphor compositions may be used in combination with other phosphors (in a blend) to produce desirable light for example, white light.

Some embodiments of the present disclosure are directed to a lighting apparatus that includes a phosphor material radiationally coupled to a light source. The phosphor material includes the phosphor composition (e.g., AlN(Eu—Sr—O)) as disclosed in above embodiments. In one embodiment, the light source can be a semiconductor radiation source, for example a light emitting diode (LED) light source. Radiationally coupled means that radiation from the light source is transmitted to the phosphor material, and the phosphor material emits radiation of a different wavelength. A combination of the light from the light source and the light emitted from the phosphor material may be used to produce a desired color emission or white light. An LED light source may be based on an LED chip that emits between about 250 nm and 550 nm. The LED chip may be coated with the phosphor material to convert some or all the radiation from the LED chip to a complementary color, e.g. a green emission or a white emission.

Non-limiting examples of lighting apparatus or devices include devices for excitation by light-emitting diodes (LEDs) such as fluorescent lamps, cathode ray tubes, plasma display devices, liquid crystal displays (LCD's), UV excitation devices, such as in chromatic lamps, lamps for backlighting, liquid crystal systems, plasma screens, xenon excitation lamps, and UV excitation marking systems. These uses are meant to be merely exemplary and not exhaustive.

FIG. 1 illustrates a lighting apparatus or lamp 10 according to some embodiments of the present invention. The lighting apparatus 10 includes a light emitting diode (LED) chip 12, and leads 14 electrically attached to the LED chip 12. The leads 14 may include thin wires supported by a thicker lead frame(s) 16. In some instances, the leads 14 may comprise self supported electrodes and the lead frame 16 may be omitted. The leads 14 provide current to LED chip 12 and thus cause it to emit radiation. The LED chip 12 may be any semiconductor blue or ultraviolet light source having an emission wavelength between about 250 nm and about 500 nm. More particularly, the LED chip 12 may be an LED having a peak emission in a wavelength from about 300 nm to about 480 nm. In lighting apparatus 10, a phosphor material 22 is disposed on a surface of the LED chip 12, and is radiationally coupled to the LED chip 12. The phosphor material 22 can be deposited on the LED chip 12 by any appropriate method known in the art. The light emitted by the LED chip 12 mixes with the light emitted by the phosphor material 22 to produce desired emission (indicated by arrow 24). The phosphor material 22 includes the AlN (Eu—Sr—O) phosphor composition as described above.

Although the general discussion of the exemplary structures of the disclosure discussed herein are directed toward inorganic LED based light sources, the LED chip may be replaced by an organic light emissive structure or other radiation source, unless otherwise noted, and that any reference to an LED chip or semiconductor is merely representative of any appropriate radiation source.

With reference to FIG. 1, the lighting apparatus 10 includes an envelope 18, which encloses the LED chip 12 and an encapsulant material 20. The envelope 18 may be, for example, glass or plastic. The LED chip 12 may be enclosed by the encapsulant material 20. The encapsulant material 20 may be a low temperature glass, or a thermoplastic or thermoset polymer, or resin as known in the art, for example, a silicone or epoxy resin. In an alternate embodiment, the lighting apparatus 10 may only comprise the encapsulant material 20 without an outer envelope 18.

Various structures of the lighting apparatus 10 are known in the art. For example, in some embodiments, the phosphor material may be interspersed within the encapsulant material, instead of being disposed directly on the LED chip 12. In some other embodiments, the phosphor material may be coated onto a surface 19 of the envelope 18, instead of being formed over the LED chip 12. The phosphor material includes the AlN(Eu—Sr—O) phosphor composition as described above. Moreover, in some embodiments, the lighting apparatus 10 may include a plurality of LED chips. These embodiments are not shown in figures. The various structures discussed with respect to FIG. 1 may be combined, with the phosphor material located in any two or all three locations or in any other suitable location, such as separately from the envelop or integrated into the LED. Further, different phosphor blends may be used in different parts of the structure.

In any of the above structures, the lighting apparatus 10 may also include a plurality of particles (not shown) to scatter or diffuse the emitted light. These scattering particles would generally be embedded in the encapsulant material 20. The scattering particles may include, for example, particles made from $Al_2O_3$ (alumina) or $TiO_2$ (titania). The scattering particles may effectively scatter the light emitted from the LED chip 12, preferably with a negligible amount of absorption.

Figure 2:
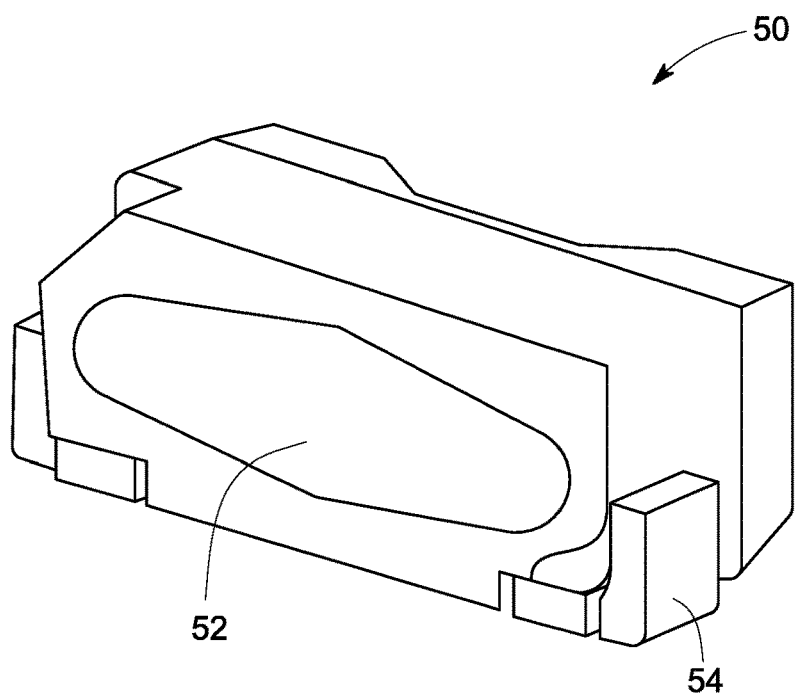
FIG. 2 is a schematic perspective view of a surface-mounted device (SMD), in accordance with some embodiments of the present disclosure.

Some embodiments include a backlight apparatus that includes a surface mounted device (SMD) type light emitting diode 50, e.g. as illustrated in FIG. 2. This SMD is a "side-emitting type" and has a light-emitting window 52 on a protruding portion of a light guiding member 54. An SMD package may comprise an LED chip as defined above, and the phosphor material that includes the AlN(Eu—Sr—O) phosphor composition as described above.

The phosphor material may further include an additional phosphor composition to form a phosphor blend to produce desired emission for example, white light from the lighting apparatus. In some embodiments, the phosphor blend may be applicable in a white light emitting LED lighting systems. In one embodiment, the phosphor blend includes the AlN (Eu—Sr—O) phosphor composition as described above, and an additional phosphor composition.

Any additional phosphor compositions, commercial and non-commercial, that form non-reactive blends with the phosphor composition of the present disclosure may be used in blends, and are considered within the scope of the present techniques. Furthermore, some additional phosphors may be used for example, those emitting throughout the visible spectrum region at wavelengths substantially different from those of the phosphor compositions described herein. These additional phosphors may be used in the blend to customize the color of the resulting light, and to produce light with improved light quality.

When the phosphor material includes a blend of two or more phosphors, the ratio of each of the individual phosphors in the phosphor blend may vary, depending on the characteristics of the desired light output, for example color temperature. The relative amounts of each phosphor composition in the phosphor blend can be described in terms of spectral weight. The spectral weight is the relative amount that each phosphor composition contributes to the overall emission spectrum of the device. The spectral weight amounts of all the individual phosphor compositions and any residual bleed from the LED light source should add up to 100%. As known to those skilled in the art, the relative proportions of each phosphor composition in the phosphor blends may be adjusted, so that when their emissions are blended and employed in a lighting apparatus, there is produced visible light of predetermined CCTs, CRIs, and color points (ccx and ccy values) on the CIE (International Commission on Illumination) chromaticity diagram.

EXAMPLES

The examples that follow are merely illustrative, and should not be construed to be any sort of limitation on the scope of the claimed invention.

Four samples (1-4) were prepared using the constituents as provided in Table 1. The constituents (as listed below in Table 1) were mixed together followed by grinding to prepare four individual mixtures. The amounts of various constituents for each sample are also provided in Table 1. For sample 1, aluminum nitride was mixed with europium oxide and strontium carbonate. For sample 2, aluminum nitride was mixed with europium oxide and silicon oxide; for sample 3, aluminum nitride was mixed with europium oxide and silicon nitride; and for sample 4, aluminum nitride was mixed with europium oxide. Each mixture was fired at about 1400 degrees Celsius in about 0.5 percent hydrogen environment for about 5 hours to prepare the four samples (1-4). Sample 4 includes only europium; samples 2 and 3 include silicon and The samples (1-4) prepared as described above were examined using X-ray diffraction (XRD). XRD results showed that the samples (1-4) were phase pure AlN. The emission spectra of individual samples (1-4) were obtained using an excitation wavelength 405 nm. FIG. 3 shows emission spectra of the four samples 1-4. The samples (1-4) had their peak emission in wavelength range 515 nm-525 nm. Sample 4 had its peak emission at a wavelength about 520 nm. FIG. 3 clearly shows that samples 2 and 3 (that include Eu, Si and O) had lower intensity than sample 1 (that includes only Eu) while sample 4 (that includes Eu, Sr and O) had much higher (more than 2 times) intensity than that of sample 1. Sample 4 was found very bright (having intensity more than two times than that of sample 1) with a peak emission at about 520 nm.

The samples (1 and 4) were further measured for quantum efficiency (QE) at an excitation wavelength 405 nm by using a quantum efficiency measuring system. Table 1 further shows spectral characteristics of four samples 1-4. The calculations also included any visible light emitted by a light source. As shown, QE of sample 4 is comparatively higher than QEs of samples 1-3. Further, sample 4 showed improved thermal quench results as compared to sample 1. The thermal quench results observed for sample 4 compared to sample 1 showed a 73% increase in efficiency (QE) at 100 degrees Celsius.

While only certain features of the disclosure have been illustrated and described herein, many modifications and changes will occur to those skilled in the art. It is, therefore, to be understood that the appended claims are intended to cover all such modifications and changes as fall within the true spirit of the invention.

The invention claimed is:

1. A phosphor composition comprising a solid solution of aluminum nitride and a complex oxide comprising europium and strontium, wherein an amount of oxygen in the solid solution is at least 0.4 weight percent and less than 1 weight percent.

2. The phosphor composition according to claim 1, wherein the amount of oxygen is in a range of from about 0.5 weight percent to about 0.9 weight percent.

3. The phosphor composition according to claim 1, wherein the solid solution is free of silicon.

4. The phosphor composition according to claim 1, wherein europium is present in an amount in a range of from about 0.5 weight percent to 8.0 weight percent.

5. The phosphor composition according to claim 1, wherein strontium is present in an amount in a range of from about 0.25 weight percent to 4 weight percent.

6. The phosphor composition according to claim 1, having a peak emission in a wavelength range from about 450 nanometers to about 550 nanometers.

7. A lighting apparatus comprising a light source and a phosphor material radiationally coupled to the light source, wherein the phosphor material comprises the phosphor composition in accordance with claim 1.

8. The lighting apparatus according to claim 7, wherein the light source comprises a light emitting diode (LED) chip.

9. A backlight apparatus comprising a light source and a phosphor material radiationally coupled to the light source, wherein the phosphor material comprises the phosphor composition in accordance with claim 1.

10. A phosphor composition derived from:
  combining aluminum nitride, europium oxide and strontium carbonate, wherein an amount of a combination of europium oxide and strontium carbonate is in a range of from about 5 weight percent to about 10 weight percent, based on an amount of aluminum nitride; and
  firing the combination.

TABLE 1

| Samples | Constituents (g) | | | | | Relative QE (%) | RT | QE (%) (Thermal Quench) 50 (° C.) | 100 (° C.) |
| --- | --- | --- | --- | --- | --- | --- | --- | --- | --- |
| | AlN | Eu$_2$O$_3$ | SiO$_2$ | Si$_3$N$_4$ | SrCO$_3$ | | | | |
| Sample 1 | 2.8809 | 0.1249 | — | — | | 46 | 100 | 70 | 22 |
| Sample 2 | 2.8497 | 0.1248 | 0.0449 | — | | 1 | | | |
| Sample 3 | 2.8229 | 0.1236 | — | 0.0329 | | 11 | | | |
| Sample 4 | 2.8101 | 0.1231 | — | — | 0.1033 | 100 | 100 | 80 | 38 |

11. The phosphor composition according to claim 10, wherein an amount of europium oxide is in a range of from about 3 weight percent to about 4 weight percent, based on the amount of aluminum nitride.

12. The phosphor composition according to claim 10, wherein an amount of strontium carbonate is in a range of from about 1.5 weight percent to about 2.5 weight percent, based on the amount of aluminum nitride.

13. The phosphor composition according to claim 10, wherein firing is carried out at a temperature in a range of from about 1300 degrees Celsius to about 2000 degrees Celsius.

14. The phosphor composition according to claim 10, wherein firing is carried out in a hydrogen-containing environment.

15. The phosphor composition according to claim 10, having a solid solution of aluminum nitride and a complex oxide comprising europium and strontium, wherein an amount of oxygen in the solid solution is at least 0.4 weight percent and less than 1 weight percent.

16. The phosphor composition according to claim 10, having a peak emission in a wavelength range from about 450 nanometers to about 550 nanometers.

17. A lighting apparatus comprising a light source and a phosphor material radiationally coupled to the light source, wherein the phosphor material comprises the phosphor composition in accordance with claim 10.

18. The lighting apparatus according to claim 17, wherein the light source comprises a light emitting diode (LED) chip.

19. A backlight apparatus comprising a light source and a phosphor material radiationally coupled to the light source, wherein the phosphor material comprises the phosphor composition in accordance with claim 10.

* * * * *